United States Patent [19]
Hosomi et al.

[11] Patent Number: 5,631,499
[45] Date of Patent: May 20, 1997

[54] SEMICONDUCTOR DEVICE COMPRISING FINE BUMP ELECTRODE HAVING SMALL SIDE ETCH PORTION AND STABLE CHARACTERISTICS

[75] Inventors: Eiichi Hosomi, Kawasaki; Chiaki Takubo, Yokohama; Hiroshi Tazawa, Ichikawa; Ryouichi Miyamoto, Kawasaki; Takashi Arai, Oita; Koji Shibasaki, Kawasaki, all of Japan

[73] Assignee: Kabushiki Kaisha Toshiba, Kawasaka, Japan

[21] Appl. No.: 656,902

[22] Filed: Jun. 3, 1996

Related U.S. Application Data

[63] Continuation of Ser. No. 428,695, Apr. 25, 1995, abandoned.

[30] Foreign Application Priority Data

Apr. 28, 1994 [JP] Japan .................... 6-090424

[51] Int. Cl.⁶ .................... H01L 23/48; H01L 23/52; H01L 29/40
[52] U.S. Cl. .................... 257/737; 257/738; 257/751; 257/780; 257/781
[58] Field of Search .................... 257/734, 737, 257/738, 780, 781, 751

[56] References Cited

U.S. PATENT DOCUMENTS 5,059,553 10/1991 Berndimaier et al. .................. 257/780
5,108,950 4/1992 Wakabayashi et al. .................. 257/739

Primary Examiner—Carl W. Whitehead, Jr.
Attorney, Agent, or Firm—Finnegan, Henderson, Farabow, Garrett & Dunner, L.L.P.

[57] ABSTRACT

A semiconductor device having a bump electrode includes a first conductive layer formed on a predetermined portion of a substrate. An insulating layer is formed on the substrate and the first conductive layer. The insulating layer has an opening portion such that a predetermined portion of the first conductive layer is exposed. A second conductive layer is formed on the first conductive layer, a side wall of the opening portion of the insulating layer, and an upper surface of the insulating layer. A third conductive layer is formed to cover at least the insulating layer on the first conductive layer and the second conductive layer along the portion. A fourth conductive layer is formed on the third conductive layer to have an over hang portion. A side etch portion is formed surrounded with an over hang portion of the fourth conductive layer, the third conductive layer, and the insulating layer.

12 Claims, 8 Drawing Sheets

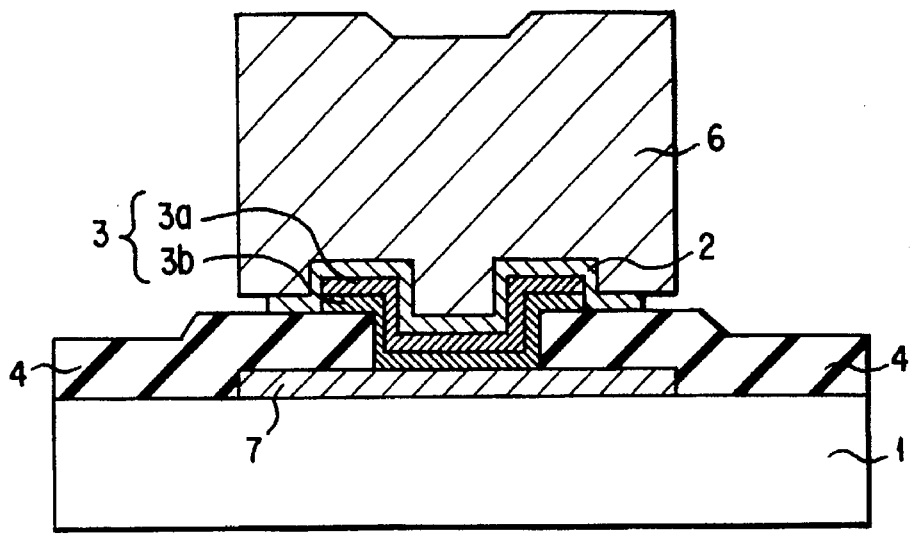
F I G. 11
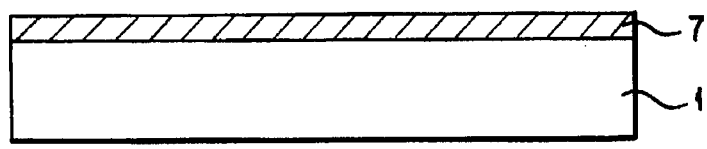
F I G. 12
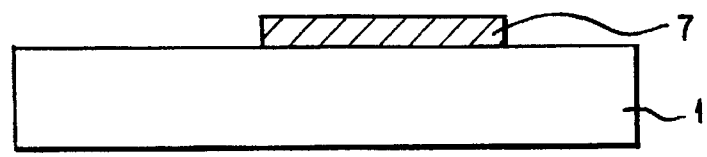
F I G. 13
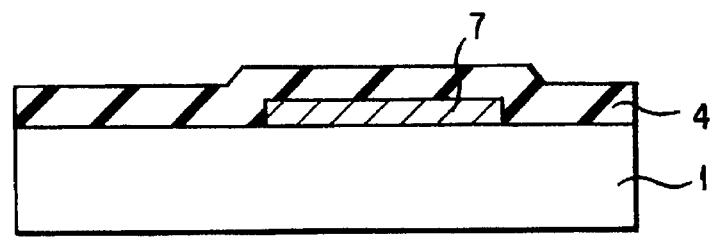
F I G. 14

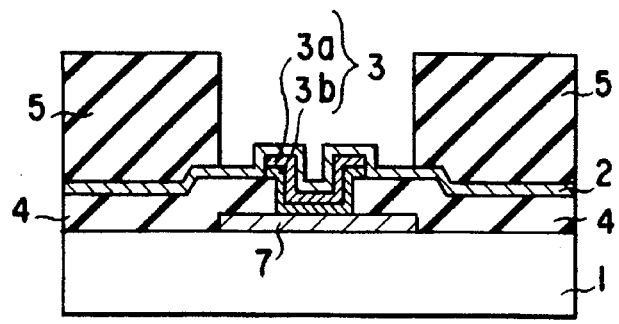
F I G. 19
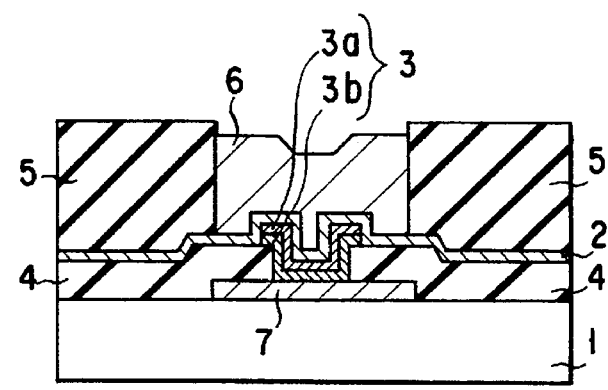
F I G. 20
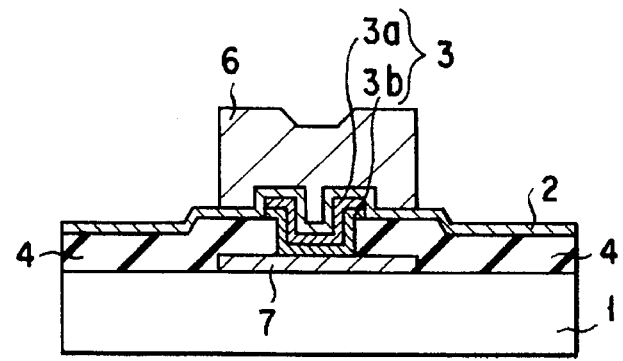
F I G. 21
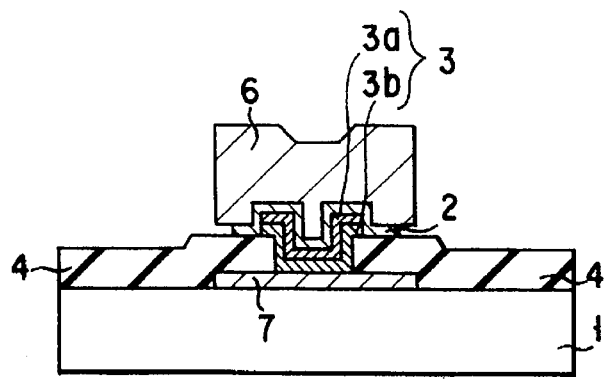
F I G. 22

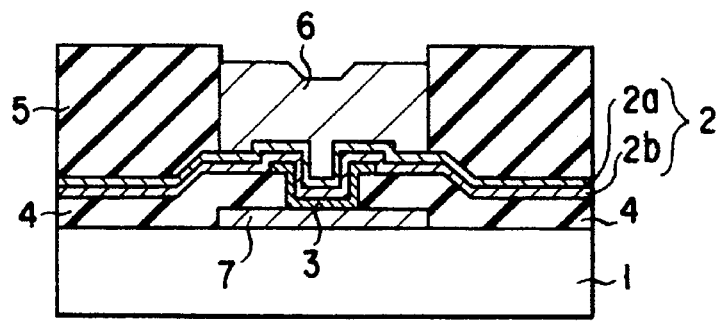
F I G. 27
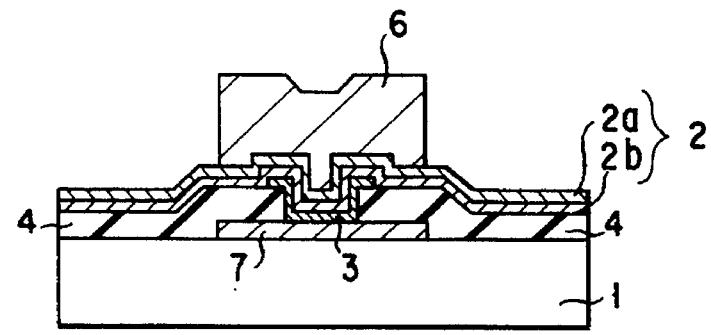
F I G. 28
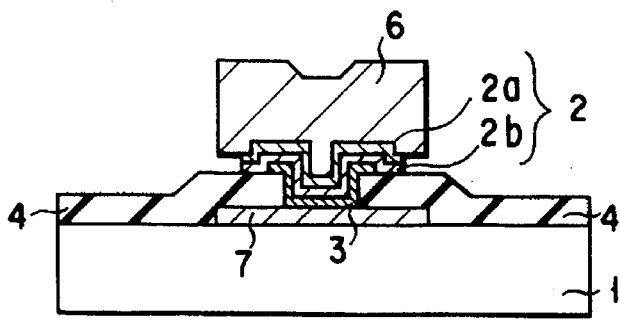
F I G. 29

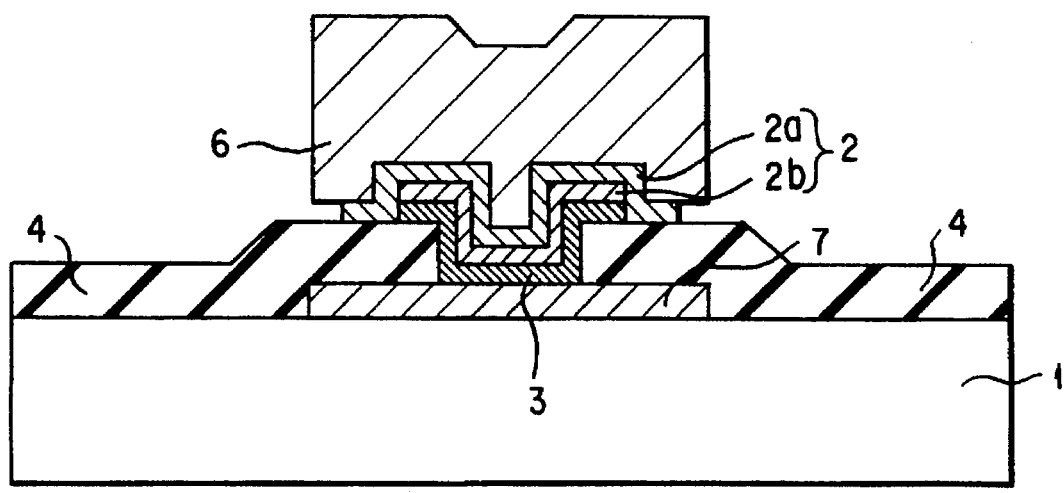
F I G. 30
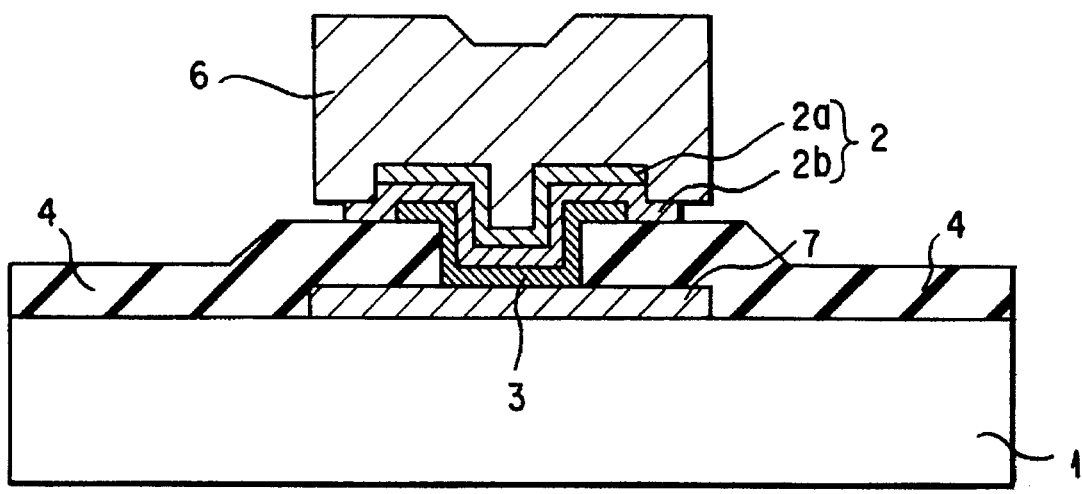
F I G. 31

SEMICONDUCTOR DEVICE COMPRISING FINE BUMP ELECTRODE HAVING SMALL SIDE ETCH PORTION AND STABLE CHARACTERISTICS

This application is a continuation of application Ser. No. 08/428,695 filed Apr. 25, 1995, now abandoned

BACKGROUND OF THE INVENTION

1. Field of the Invention

The present invention relates to improvement of the structure of a semiconductor device having a bump electrode and particularly to a semiconductor device, having fine the bump electrode and having stable electrical characteristics, and its manufacturing method.

2. Description of the Related Art

In a semiconductor device, which is connected by TAB (Tape Automated Binding), a projection-shaped metallic electrode (hereinafter called bump electrode) is formed on an electrode pad. Normally, Al or an alloy containing Al is used as an electrode pad. However, when the bump electrode is directly formed on the electrode pad, there is a case in which Al and the bump electrode react with each other to generate an intermetallic compound. In general, there is a high degree of risk in the use of the intermetallic compound, so that reliability of the device may be lost. Due to this, a plurality of thin metal film layers (hereinafter called as barrier metals) are normally formed between the electrode pad and the bump electrode to prevent Al and the bump electrode from reacting with each other to generate an alloy. The barrier metals are used to improve intensity of adhesion between the bump electrode and the electrode pad.

FIG. 1 is a cross sectional view showing the conventional bump electrode and its peripheral devices.

An electrode pad 7 is formed on a substrate 1 of a semiconductor integrated circuit. A passivation film 4, serving as an insulation film, is formed on the entire surface of the substrate 1 including the electrode pad 7. A passivation opening section which is formed at a predetermined position, is formed to expose the electrode pad 7. The opening section is formed of a side wall of an end portion of the passivation film 4 near the electrode pad 7 and an upper surface of the electrode pad, which is free of the passivation film 4. Moreover, the passivation opening section and the upper surface of the end portion of the passivation film 4 are covered with a barrier metal 3.

The barrier metal 3 is normally a two-layer structure having a first barrier metal 3a and a second barrier metal 3b. A bump electrode 6 is formed on the first barrier metal 3a.

The following will explain the conventional manufacturing method of the semiconductor device with reference to FIGS. 2 to 10.

FIG. 2 shows a process of forming the electrode pad 7.

A metal, serving as a metal electrode 7, such as an alloy of Al-Cu-Si is formed on the entire surface of the substrate 1. FIG. 3 shows a process of patterning the electrode pad 7.

The electrode pad 7 formed on the entire surface of the substrate 1 is etched by resist (not shown) to be patterned.

FIG. 4 shows a process of forming the passivation film 4.

The passivation film 4 is formed on the entire surface of the substrate 1 to completely cover the electrode pad 7.

FIG. 5 shows a process of forming the passivation opening section.

The passivation film 4 is etched such that a predetermined surface of the electrode pad 7 is exposed. A portion, which is surrounded with the exposed surface of the electrode pad 7 and the side surface of the passivation film 4 above the electrode pad, is the passivation opening section.

FIG. 6 shows a process of forming the barrier metal 3.

The barrier metal 3 is formed on the passivation film 4 and the passivation opening section by sputtering. The barrier metal 3 is normally a two-layer structure comprising a first barrier metal 3a and a second barrier metal 3b.

In a case where Au is used as a bump electrode (not shown) formed on the first barrier metal 3a in a later process, as an example of the barrier metal 3, there are used a sputtering thin film of Ni having a thickness of 300 nm, serving as a first barrier metal 3a, and a sputtering thin film of Ti having a thickness of 100 nm, serving as a second barrier metal 3b.

FIG. 7 shows a process of patterning resist 5.

First, the entire upper surface of the first barrier metal 3a is coated with resist 5. Then, resist 5 on the electrode pad 7 is removed to be opened such that the surface of the first barrier metal 3a of the upper portion of the electrode pad 7 is exposed. A portion, which is surrounded with the exposed surface of the first barrier metal 3a and the wall of the opening of resist 5, is used as a resist opening section.

FIG. 8 shows a process of forming the bump electrode 6.

The bump electrode 6 is formed on the resist opening section by electrolytic plating with the first barrier metal 3a as a plating electrode. The height of the bump electrode 6 is generally 10 to 20 μm.

FIG. 9 shows a process of removing resist 5.

Resist 5 is removed such that the bump electrode 6 is left.

FIG. 10 shows a process of patterning the barrier metal 3.

The barrier metal 3 around the bump electrode 6 is partially removed by wet etching, and the barrier metal 3 is left under the bump electrode 6.

As material of the barrier metal 3, Ni and Ti are used. Ni is etched with a mixed solution of $HNO_3$, HCl, and $CH_3COOH$ and Ti is etched with a water solution of HF.

The above is the outline of the conventional semiconductor device and its manufacturing method. However, in the conventional manufacturing method, there is a problem in that a large side etch portion is generated in the process of removing the barrier metal 3 of FIG. 10.

The side etch portion is a portion, which is surrounded with the bump electrode 6 adjacent barrier metal 3, the end portion of the barrier metal 3, and the portion of the passivation film 4 adjacent barrier metal 3.

The generation of the side etch portion is a phenomenon in which etching is advanced from the peripheral portion of the bump electrode 6 to the portion just under the bump electrode 6 in addition to the barrier metal 3 exposed onto the surface and a over-hang shape is generated. This phenomenon is caused when the etching for removing the barrier metal 3 is an isotropic etching using corrosive liquid, and the etching rate of the bump electrode 6 and that of the barrier metal 3 are different.

If the side etch portion is advanced up to the passivation opening section, there occurs a phenomenon in which the electrode pad 7 corrodes and the electrical connection between the electrode pad 7 and the bump electrode 6 is broken. This phenomenon produced a detective contact, and reliability of the semiconductor device is considerably reduced.

Due to this, in the manufacturing process, the size of the bump electrode 6 is larger than the passivation opening section to have an allowable positioning variation. However, the size of the bump electrode must be set to be more than necessary in order to prevent generation of a defective contact due to the side etch.

The point of making the size of the bump electrode 6 larger than the passivation opening section has recently become an obstacle to the need of reducing the size of the bump electrode 6.

In order to eliminate the above-mentioned side etch portion, there is a method in which the barrier metal 3 is coated with resist 5 again just before being removed after the bump electrode 6 is formed, and the etching of the barrier metal 3 is performed by the resist patterning.

Moreover, there is a method of removing the side etch by dry-etching using plasma in place of the wet system using the solution.

However, in the former method, there are difficulties in the resist coating after the bump electrode 5 is formed and the removal of resist 5, and such coating and removal become complicated. In the latter method, though the number of processes is the same as the conventional case, a dry-etching device is expensive, and the the number of through puts is reduced since vacuum is introduced in the process, so that the manufacturing cost is increased.

As mentioned above, in the conventional semiconductor device, the size of the bump electrode must be enlarged in order to avoid the defective contact, and so that unfavorable influence is exerted on reducing the size of the bump electrode.

SUMMARY OF THE INVENTION

In order to eliminate the above-mentioned problems, an object of the present invention is to provide a semiconductor device having a reduced size bump electrode device having stable electrical characteristics, and its manufacturing method.

In order to attain the above object, there is provided a semiconductor device having a bump electrode comprising a substrate; a first conductive layer formed on a predetermined portion of the substrate; an insulating layer formed on the substrate and the first conductive layer, and the insulating layer having an opening portion such that a predetermined portion of the first conductive layer is exposed; a second conductive layer formed on the first conductive layer, a side wall of the opening portion of the insulating layer, and an upper surface thereof; a third conductive layer formed to cover at least the insulating layer on the first conductive layer and the second conductive layer along the opening portion; and a fourth conductive layer provided on the third conductive layer to have an overhang-shaped portion on the third conductive layer, the overhang-shaped portion of the fourth conductive layer, the third conductive layer, and the insulating layer form a side etch portion.

Moreover, according to the present invention, there is provided a method of forming a semiconductor device having a bump electrode comprising the steps of forming a first conductive layer formed on a predetermined portion of a substrate; forming an insulating layer formed on the substrate and the first conductive layer; forming an opening in the insulating layer such that a predetermined portion of the first conductive layer is exposed; forming a second conductive layer formed on the first conductive layer, a side wall of the opening portion of the insulating layer, and an upper surface thereof; forming a third conductive layer to cover at least the insulating layer on the first conductive layer and the second conductive layer along the opening portion; and forming a fourth conductive layer on the third conductive layer to have an overhang-shaped portion, the overhang-shaped portion of the fourth conductive layer, the third conductive layer and the insulating layer forming a side etch portion.

According to the above-mentioned semiconductor device and its manufacturing method, since the side etch portion is small, the contact defective can be avoided, and the electrical characteristics of the bump electrode can be improved. Moreover, by use of means provided in the present invention, the barrier metal is patterned before the bump electrode is formed, and the thin metal film is formed between the bump electrode and the barrier metal to cover the barrier metal. Due to this, the barrier metal is not removed in the etching process after the bump electrode is formed.

As a result, there can be provided a manufacturing method of the semiconductor device having a reduced size bump electrode having stable electrical characteristics.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 11 is a cross-sectional view of a semiconductor device having a bump electrode of a first embodiment of the present invention;

FIG. 12 is a cross-sectional view showing a process for forming metal to be used as an electrode pad on the substrate according to the present invention;

FIG. 13 is a cross-sectional view showing a process for patterning the electrode pad to be formed on the substrate sequel to FIG. 12;

FIG. 14 is a cross-sectional view showing a process for forming a passivation film on the substrate having the electrode pad sequel to FIG. 13;

FIG. 19 is a cross-sectional view showing a process for patterning resist to be formed on the thin metal film, and for forming a resist opening portion sequel to FIG. 18;

FIG. 20 is a cross-sectional view showing a process for forming a bump electrode on the resist opening portion sequel to FIG. 19;

FIG. 21 is a cross-sectional view showing a process for leaving the pump electrode and for removing resist sequel to FIG. 20;

FIG. 22 is a cross-sectional view showing a process for removing the thin metal film sequel to FIG. 21;

FIG. 27 is a cross-sectional view showing a process for forming a bump electrode on the resist opening portion sequel to FIG. 26;

FIG. 28 is a cross-sectional view showing a process for leaving the bump electrode, and for removing resist sequel to FIG. 27;

FIG. 29 is a cross-sectional view showing a process for removing the thin metal film sequel to FIG. 28;

FIG. 30 is a view showing an example of the structure of the side etch portion of the first and second embodiments of the present invention; and FIG. 31 is a view showing further example of the structure of the side etch portion of the first and second embodiments of the present invention.

DETAILED DESCRIPTION OF THE PREFERRED EMBODIMENTS

Figure 1:
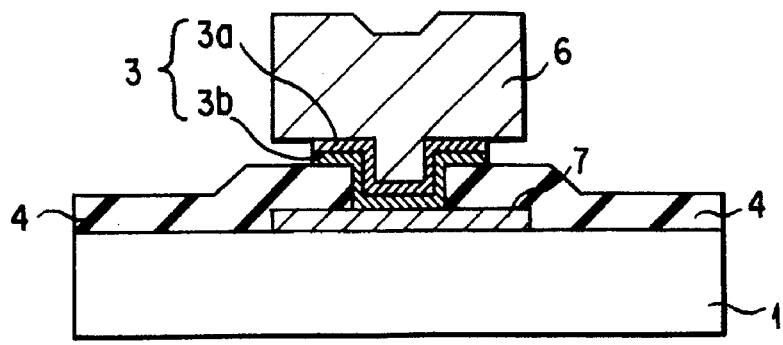
FIG. 1 is a cross sectional view of a conventional semiconductor having a bump electrode.
Figure 2:
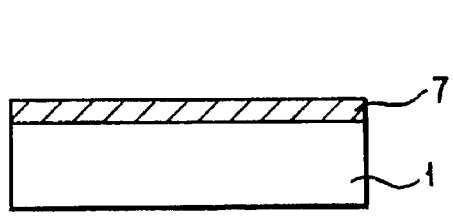
FIG. 2 is a cross sectional view showing a conventional process for forming metal to be used as an electrode pad on a substrate.
Figure 3:
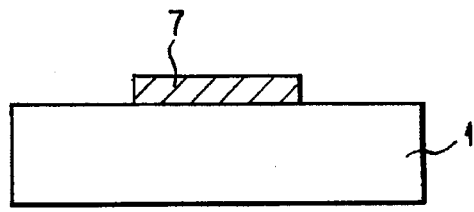
FIG. 3 is a cross-sectional view showing a process for patterning the electrode pad to be formed on the substrate sequel to FIG. 2.

Embodiments of the present invention will be explained with reference to the drawings.

FIG. 11 is a cross-sectional view of a semiconductor device having a bump electrode of a first embodiment of the present invention. An electrode pad 7 is formed on a substrate 1 of a semiconductor integrated circuit.

A passivation film 4, serving as an insulation film, is formed on an upper surface of the electrode pad 7, and a passivation opening section is formed at a predetermined position to expose the electrode pad 7.

The opening section is formed on a side wall of an end portion of the passivation film 4 near the electrode pad 7 and an upper surface, free of the passivation film 4, of the electrode pad 7. Moreover, the passivation opening section and a part of the upper surface of the end portion of the passivation film 4 are covered with a barrier metal 3.

In FIG. 11, the barrier metal 3 is a two-layer structure having a first barrier metal 3a and a second barrier metal 3b. However, there is a case in which one or three layers, or more, can be used.

As a barrier metal 3, for example, Ni is used as barrier metal 3a, and Ti is used as barrier metal 3b. In the case of the three-layer structure, Pd is formed on the first barrier metal 3a as a third barrier metal.

Figure 4:
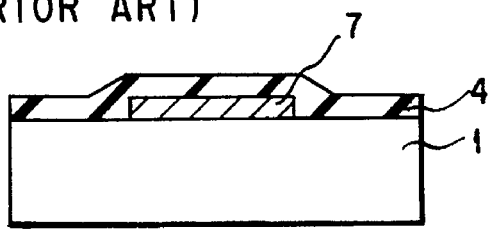
FIG. 4 is a cross-sectional view showing a process for forming a passivation film on the substrate having the electrode pad sequel to FIG. 3.
Figure 5:
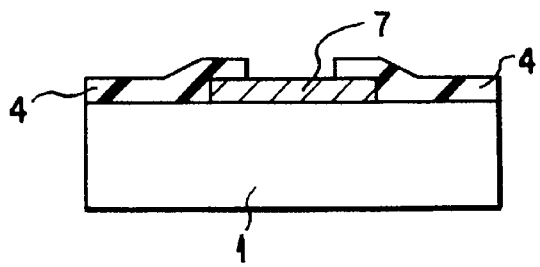
FIG. 5 is a cross-sectional view showing a process for forming an opening portion in the passivation film sequel to FIG. 4.
Figure 6:
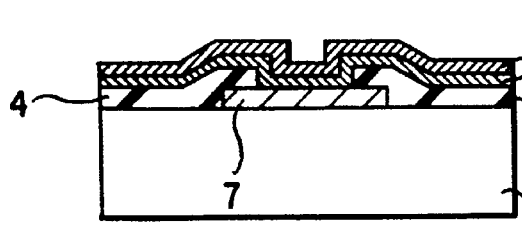
FIG. 6 is a cross-sectional view showing a process for forming a barrier metal on the passivation film and the opening portion sequel to FIG. 5.
Figure 7:
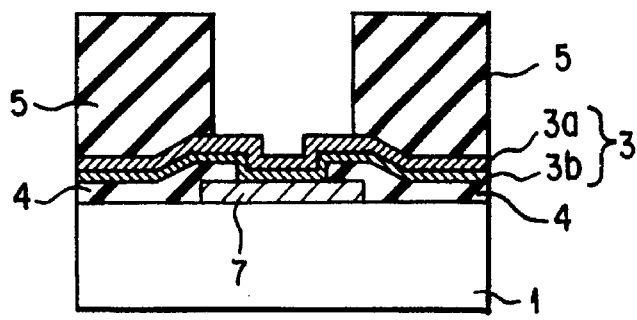
FIG. 7 is a cross-sectional view showing a process for patterning resist to be formed on the barrier metal sequel to FIG. 6.
Figure 8:
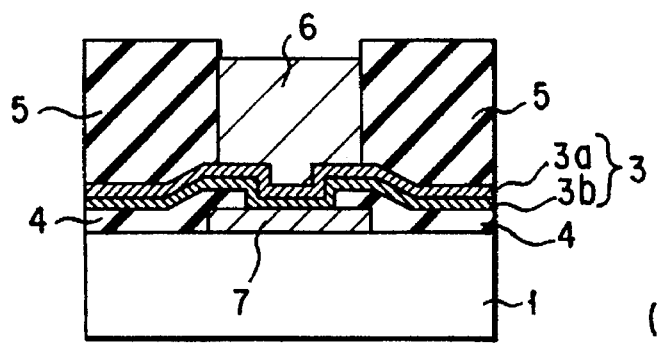
FIG. 8 is a cross-sectional view showing a process for forming a bump electrode sequel to FIG. 7.
Figure 9:
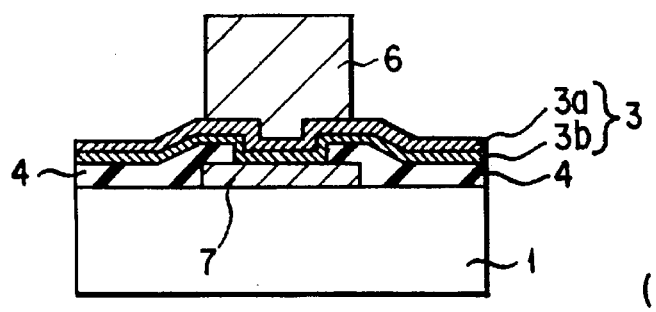
FIG. 9 is a cross-sectional view showing a process for leaving the bump electrode and removing resist sequel to FIG. 8.
Figure 10:
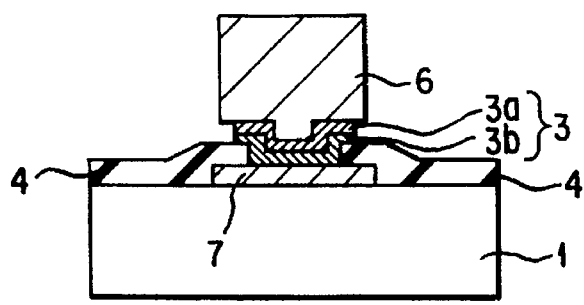
FIG. 10 is a cross-sectional view showing a process for patterning the barrier metal wherein a side etch portion is formed sequel to FIG. 9.

The barrier metal 3 and the region around the upper surface of the passivation film 4 are covered with the thin metal film 2. As shown in FIG. 4, the thin metal film 2 covers barrier metal 3 along the opening in passivation film 4 and covers an edge of barrier metal 3 on passivation film 4. Thin metal film 2 also covers a portion of passivation film 4 beyond the edge of barrier metal 3. The thickness of the thin metal film 2 is smaller than that of the barrier metal 3.

Moreover, Au, for example, is formed on the thin metal film 2 as a bump electrode 6.

The following will explain a manufacturing method of the semiconductor device of the first embodiment.

FIG. 12 shows a process for forming the electrode pad 7.

Metal, serving as an electrode pad 7, such as an alloy of Al-Cu-Si is formed on the surface of the substrate 1.

FIG. 13 shows a process for patterning the electrode pad 7.

The electrode pad 7, which is formed on the surface of the substrate 1, is etched with resist (not shown), to be patterned.

FIG. 14 shows a process for forming the passivation film 4.

The passivation film 4 is formed on the surface of the substrate 1 to cover the overall surface of the electrode pad 7.

Figure 15:
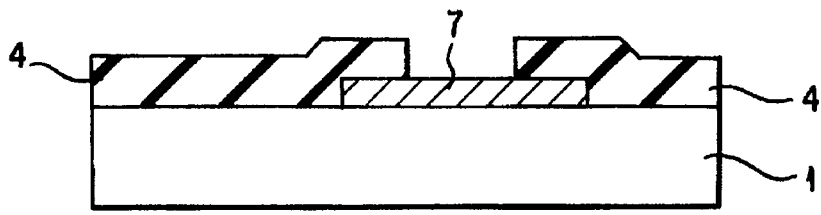
FIG. 15 is a cross-sectional view showing a process for forming an opening portion in the passivation film sequel to FIG. 14.

FIG. 15 shows a process for forming the passivation opening section.

The passivation film 4 is etched such that a predetermined surface of the electrode pad 7 is exposed. A portion, which is surrounded with the exposed surface of the electrode pad 7 and the side wall of the passivation film 4 on the electrode pad 7, is the passivation opening section.

Figure 16:
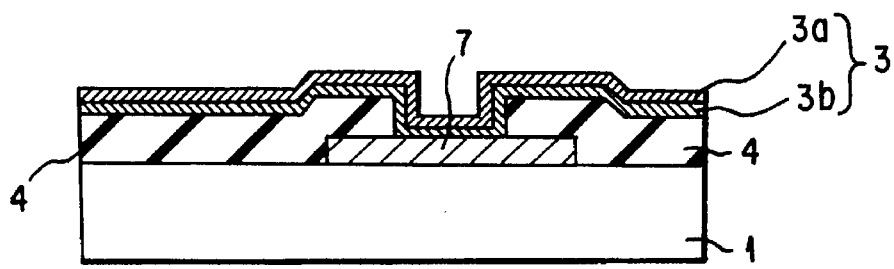
FIG. 16 is a cross-sectional view showing a process for forming a barrier metal on the passivation film and the opening portion sequel to FIG. 15.

FIG. 16 is a process for forming the barrier metal 3.

The barrier metal 3 is formed on the passivation film 4 and the passivation opening section by sputtering. The barrier metal 3 is the two-layer structure having a first barrier metal 3a and a second barrier metal 3b. At this time, any number of layers of the barrier metal 3 may be formed.

In a case where Au is used as a bump electrode (not shown) formed on the first barrier metal 3a in a later process, as an example of the barrier metal 3, there may be used a sputtering thin film of Ni having a thickness of 300 nm, serving as a first barrier metal 3a, and a sputtering thin film of Ti having a thickness of 100 nm, serving as a second barrier metal 3b. Moreover, in the case of the three-layer structure, a Pd thin film may be formed on the first metal 3a as a third barrier metal by sputtering.

Figure 17:
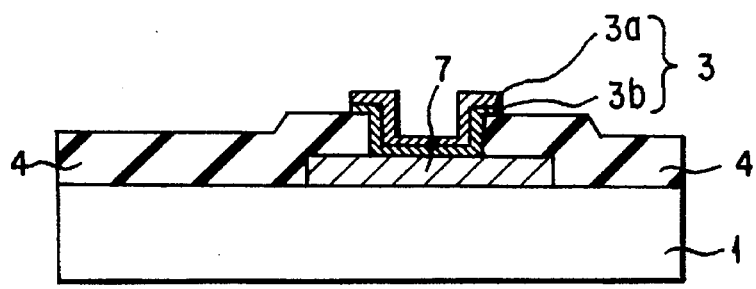
FIG. 17 is a cross-sectional view showing a process for patterning resist to be formed on the barrier metal sequel to FIG. 16.

FIG. 17 shows a process for patterning the barrier metal 3.

The barrier metal 3 is patterned by wet-etching.

In the above-embodiment, Ni of the first barrier metal 3a is etched with mixing solution of $HNO_3$, HCl, and $CH_3COOH$, and Ti of the second barrier metal 3b is etched with water solution of HF.

Figure 18:
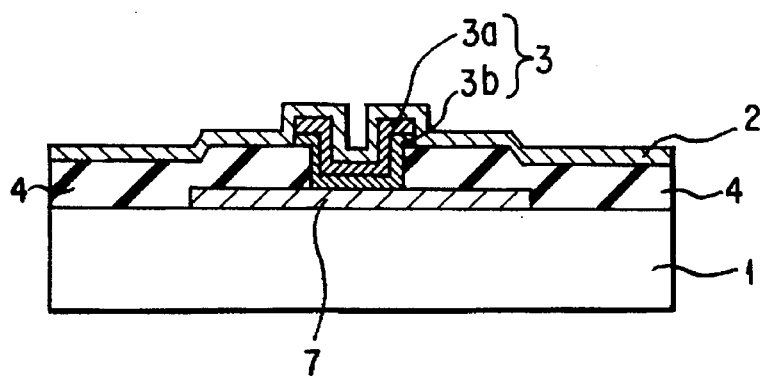
FIG. 18 is a cross-sectional view showing a process for forming a thin metal film on the passivation film and the barrier metal sequel to FIG. 17.

FIG. 18 shows a process for forming the thin metal film 2.

The thin metal film 2 is formed on the first barrier metal 3a and the passivation film 4. At this time, the thickness of the thin metal film 2 is smaller than that of the barrier metal 3.

FIG. 19 shows a process for patterning resist 5.

First, resist 5 is applied onto the entire surface of the thin metal film 2, patterned, and opened to obtain an opening portion, which is wider than the barrier metal 3, by an exposing method.

FIG. 20 shows a process for forming the bump electrode 6.

The bump electrode 6 is formed on the resist opening section by electrolytic plating with the thin metal film 2 as a plating electrode.

The height of the bump electrode 6 is generally 10 to 20 μm.

FIG. 21 shows a process for removing resist 5.

Resist 5 is removed such that the bump electrode 6 is projected onto the thin metal film 2.

FIG. 22 shows a process for removing the thin metal film 2.

The thin metal film 2 is partially removed by wet-etching such that the thin metal film 2 just under the bump electrode 6 is left in a state that a bump electrode 6 is used as a mask. Thus, thin metal film 2 extends onto passivation film 4 sufficiently beyond the edge of barrier metal 3 that the edge of barrier metal 3 has been protected from side-etching.

Since the wet etching is an isotropic etching using corrosive liquid, a side etch portion is generated similar to the conventional case. The side etch portion is a portion, which is surrounded with the bump electrode 6, the end portion of the thin metal film 2, and the passivation film 4.

The side etch portion is formed when etching of the passivation film 4 is advanced from the surroundings of the bump electrode 6 toward the center.

Since the thickness of the thin metal film 2 is smaller than that of the barrier metal 3, etching is ended in a short period of time, and the side etch portion may be smaller than the conventional case.

The thin metal film 2 is used to preserve intensity of adhesion between the bump electrode and the passivation film 4. Also, the thin metal film 2 covers the entire surface of the barrier metal 3 to prevent the barrier metal 3 from being etched.

It can be considered that the same kind of metal as the bump electrode 6 is used as a thin metal film 2. In this embodiment, an Au thin film is used as a metal thin film 2. The thin metal film 2 is etched to be removed, and the bump electrode 6 is slightly etched to be removed at substantially the same etching rate simultaneously. Due to this, the side etch portion is smaller than the case in which the thin metal film 2 and the bump electrode 6 are formed of different types of metal.

Moreover, if the annealing is provided just before the process of removing the thin metal film 2, the recrystallization is advanced in the bump electrode 6 and the thin metal film 2. Then, the microstructure of the thin metal film 2 and the bump electrode 6 are similar to each other. The etching rates approximate to each other, so that the side etch portion can be much smaller.

Furthermore, the different kinds of metal from the barrier metal 3 and the bump electrode 6 can be used as a thin metal film 2. For example, in the case that the barrier metal 3 and the bump electrode 6 are the same as the previous case, Cu can be used as a thin metal film 2. If ammonium hydroxide ($NH_4OH \cdot H_2O_2$) is selected as corrosive liquid used in etching Cu, the barrier metal 3 does not react with ammonium hydroxide; and no defective contact occurs even if etching of Cu is advanced to the end portion of the barrier metal.

Figure 23:
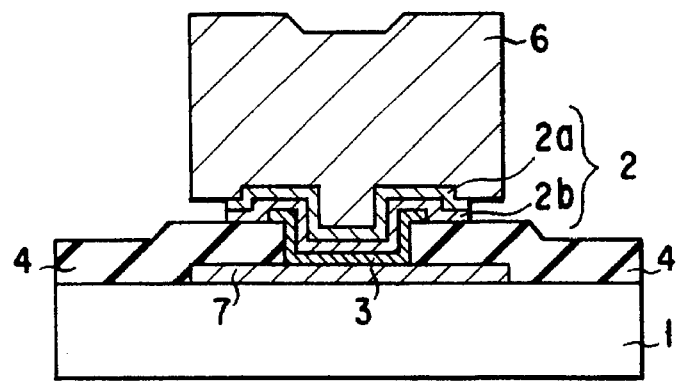
FIG. 23 is a cross-sectional view of a semiconductor device having a bump electrode of a second embodiment of the present invention.

FIG. 23 is a cross-sectional view of a semiconductor device having a bump electrode of a second embodiment of the present invention.

In the second embodiment, the thin metal film 2 has the two-layer structure comprising the first thin metal film 2a and the second thin metal film 2b, and the barrier metal 3 is formed of one layer.

Moreover, Pd is used as first thin metal film, Ni is used as second thin metal film, Ti is used as barrier metal 3, and Au is used as bump electrode 6.

The following will explain the manufacturing method of the semiconductor device of the second embodiment.

The different point from the first embodiment is as follows:

More specifically, in the process of forming the barrier metal 3 shown in FIG. 16 and the process of forming the thin metal film 2 shown in FIG. 18, the barrier metal 3 is a one-layer structure, the thin metal film 2 is a two-layer structure, and the first thin metal film 2a is formed on the second thin metal film 2b.

The process of forming the barrier 3 will be explained as follows.

Figure 24:
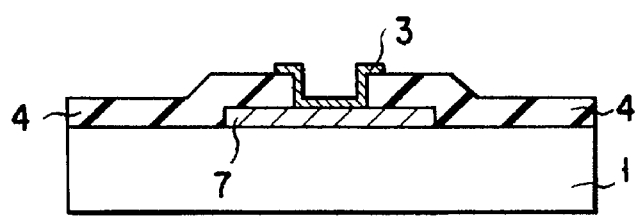
FIG. 24 is a view showing a process for patterning a barrier metal formed on the electrode pad.

FIG. 24 shows the process of patterning the barrier 3.

The barrier metal 3 is patterned by wet-etching. In the case where Ti is used as barrier metal 3, the barrier metal 3 is etched with HF water solution.

Figure 25:
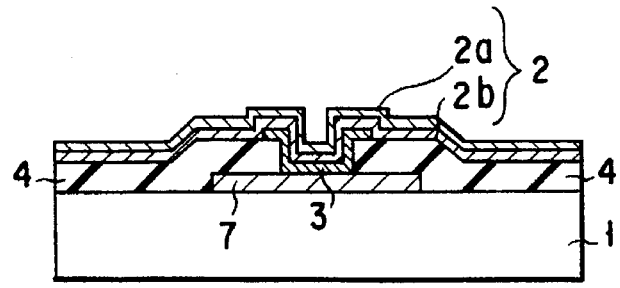
FIG. 25 is a view showing a process for forming a thin metal film on the passivation film and the barrier metal sequel to FIG. 24.

FIG. 25 shows the process of forming the first thin metal film 2a and the second thin metal film 2b.

First, the second thin metal film 2b is formed on the barrier metal 3 and the surface of the passivation film 4. Next, the first thin metal film 2a is formed on the entire surface of the second thin metal film 2b. At this time, in consideration of the reduction of the side etch portion and that of the etching time in the later process, that is, the process of removing the thin metal film 2a and the thin metal film 2b, the thickness of the first thin metal film 2a and that of the second thin metal film 2b are desirably small as possible.

Figure 26:
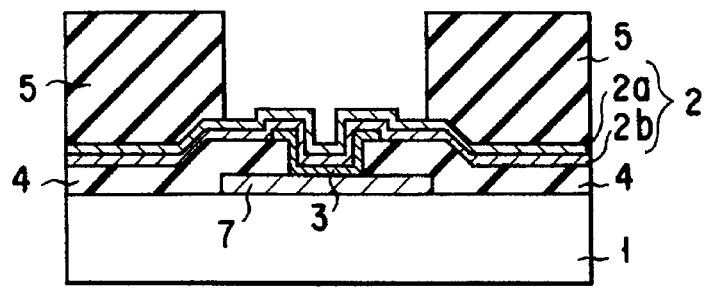
FIG. 26 is a cross-sectional view showing a process for patterning resist to be formed on the thin metal film sequel to FIG. 25.

FIG. 26 shows the process of the patterning resist 5.

First, the surface of the first thin metal film 2a is coated with resist 5. Then, resist 5 on the electrode pad 7 is removed and opened by PEP such that the surface of the first thin metal film 2a is exposed.

A portion, which is surrounded with the exposed surface of the first thin metal film 2a and the cross section of the opening of resist 5, is used as a resist opening section.

FIG. 27 shows the process of forming the bump electrode 6.

The bump electrode 6 is formed on the resist opening section by electrolytic plating with the first thin metal film 2a as a plating electrode. The height of the bump electrode 6 is generally 10 to 20 μm.

FIG. 28 shows the process of removing resist 5.

Resist 5 is removed such that the bump electrode 6 is projected onto the first thin metal film 2a.

FIG. 29 shows the process of removing the first thin metal film 2a and the second thin metal film 2b.

The first and second thin metal films 2a and 2b are partially removed by wet-etching such that the first and second thin metal thin films 2a and 2b just under the bump electrode 6 is left in a state that the bump electrode 6 is used as a mask.

Since wet-etching is an isotropic etching using corrosive liquid, the side etch portion is generated similar to the conventional case. A portion, which is surrounded with an adjacent portion of the bump electrode 6, the end portion of the first thin metal film 2a and the second thin metal film 2b, and an adjacent portion of the passivation film 4, is the side etch portion.

The side etch portion is formed when etching of the passivation film 4 is advanced from the surroundings of the bump electrode 6 toward the center.

The first and second thin metal films 2a and 2b are used to reserve intensity of adhesion between the bump electrode 6 and the passivation film 4. Also, the thin metal film 2 covers the entire surface of the barrier metal 3 to prevent the barrier metal 3 from being etched.

In the above embodiment, it is not necessarily needed that both first and second thin metal films 2a and 2b are used. Either the first thin metal film 2a or the second thin metal film 2b may be included in the structure of the side etch portion.

For example, as shown in FIG. 30, if the first thin metal film 2a entirely covers the second thin metal film 2b so that the end portion of the first thin metal film 2a is exposed. As shown in FIG. 31, there is a case that the first thin metal film 2a partially covers the portions other than the end portion of the second thin metal film 2b, and the end portion of the second thin metal film is exposed in the side etch portion.

The number of layers of the thin metal films to be exposed is set to the minimum number, that is, one layer, the side etch portion can be made small even if any number of layers of the thin metal films is used.

As mentioned above, according to the present invention, there can be obtained a semiconductor device having an extremely small side etch portion and a reduced-size bump electrode device having stable electrical characteristics, and its manufacturing method.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device having a bump electrode comprising:
    a substrate;
    a first conductive layer on a predetermined portion of said substrate;
    an insulating layer on said substrate and said first conductive layer, and said insulating layer having an opening portion via which a predetermined portion of said first conductive layer is exposed;
    a second conductive layer formed on said first conductive layer, a side wall of the opening portion of said insulating layer, and an upper surface of said insulating layer;
    a third conductive layer covering said second conductive layer along said opening portion and an edge of said second conductive layer on said insulating layer and extending onto said insulating layer beyond said edge of said second conductive layer sufficiently to prevent side-etching of said edge; and
    a fourth conductive layer provided on said third conductive layer, said fourth conductive layer, said third conductive layer, and said insulating layer together forming a side-etch region exclusive of the first and second conductive layers.

2. The device according to claim 1, wherein said first conductive layer comprises an electrode pad.

3. The device according to claim 1, wherein said second conductive layer comprises a barrier metal.

4. The device according to claim 1, wherein said second conductive layer comprises a multi-layered structure.

5. The device according to claim 1, wherein said third conductive layer comprises a metallic film.

6. The device according to claim 1, wherein said third conductive layer comprises a multi-layered structure.

7. The device according to claim 1, wherein a thickness of said third conductive layer is thinner than a thickness of said second conductive layer.

8. The device according to claim 1, wherein said fourth conductive layer is a bump electrode.

9. The device according to claim 1, wherein said fourth conductive layer is formed of the same metallic material as said third conductive layer.

10. The device according to claim 1, wherein microstructure of said fourth conductive layer is similar to that of said third conductive layer.

11. A semiconductor device having a bump electrode comprising:
    a substrate;
    a first conductive layer on a predetermined portion of said substrate;
    an insulating layer on said substrate and said first conductive layer, and said insulating layer having an opening portion via which a predetermined portion of said first conductive layer is exposed;
    a second conductive layer formed on said first conductive layer, the opening portion of said insulating layer, and an upper surface of said insulating layer;
    a third conductive layer covering said second conductive layer along said opening portion and extending onto said insulating layer beyond an edge of said second conductive layer sufficiently to improve adhesion between said third conductive layer and said insulating layer and adhesion between said third conductive layer and said fourth conductive layer; and
    a fourth conductive layer provided on said third conductive layer.

12. A semiconductor device having a bump electrode comprising:
    a substrate;
    a first conductive layer on a predetermined portion of said substrate;
    an insulating layer on said substrate and said first conductive layer, and said insulating layer having an opening portion via which a predetermined portion of said first conductive layer is exposed;
    a second conductive layer of successive laminar layers of titanium and nickel formed on said first conductive layer, the opening portion of said insulating layer, and an upper surface of said insulating layer;

a third conductive layer of copper covering said second conductive layer along said opening portion and extending onto said insulating layer beyond said second conductive layer; and a fourth conductive layer of gold provided oil said third conductive layer.

* * * * *

UNITED STATES PATENT AND TRADEMARK OFFICE
CERTIFICATE OF CORRECTION

PATENT NO. : 5,631,499
DATED : May 20, 1997
INVENTOR(S) : Eiichi HOSOMI et al.

It is certified that error appears in the above-indentified patent and that said Letters Patent is hereby corrected as shown below:

In Claim 12, Col. 12, line 1, "oil" should read --on--.

Signed and Sealed this

Fourteenth Day of October, 1997

Attest:

BRUCE LEHMAN

Attesting Officer

Commissioner of Patents and Trademarks